(12) United States Patent
Lee

(10) Patent No.: US 7,317,338 B2
(45) Date of Patent: Jan. 8, 2008

(54) DATA INPUT BUFFER IN SEMICONDUCTOR DEVICE

(75) Inventor: Jong-Chern Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 214 days.

(21) Appl. No.: 11/182,230

(22) Filed: Jul. 15, 2005

(65) Prior Publication Data

US 2006/0208762 A1 Sep. 21, 2006

(30) Foreign Application Priority Data

Mar. 21, 2005 (KR) .................... 10-2005-0023334

(51) Int. Cl.
 *H03K 19/0175* (2006.01)
 *H03K 19/094* (2006.01)

(52) U.S. Cl. ..................... 326/87; 326/68; 326/86; 327/109; 327/333

(58) Field of Classification Search ............... 326/68, 326/83, 86, 87; 327/108, 109, 333
See application file for complete search history.

(56) References Cited

U.S. PATENT DOCUMENTS

| 5,736,871 A | * | 4/1998 | Goto | 326/115 |
| 5,939,937 A | * | 8/1999 | Terletzki | 327/541 |
| 2006/0132171 A1 | * | 6/2006 | Nguyen | 326/30 |

FOREIGN PATENT DOCUMENTS

TW 502121 9/2002

OTHER PUBLICATIONS

Gray et al, Analysis and Design of Analog Integrated Circuits, 2001, John Wiley & Sons, Inc., Fourth Edition, pp. 257-258.*

* cited by examiner

*Primary Examiner*—Rexford Barnie
*Assistant Examiner*—Crystal L Hammond
(74) *Attorney, Agent, or Firm*—Blakely, Sokoloff, Taylor & Zafman

(57) ABSTRACT

The present invention provides an input buffer for use in a semiconductor device reducing a current consumption and maintaining a reliable operation speed by detecting a level of the reference voltage. The input buffer includes a comparator, having a first biasing device controlled by a buffer enable signal, for sensing a logic level of an input data by comparing voltage levels of a reference voltage and the input data, a reference voltage detector for detecting the level of the reference voltage, and a second biasing device controlled by an output signal from the reference voltage detector and parallel connected to the first biasing device.

12 Claims, 6 Drawing Sheets

DATA INPUT BUFFER IN SEMICONDUCTOR DEVICE

FIELD OF INVENTION

The present invention relates to an input buffer for use in a semiconductor memory device; and, more particularly, to an input buffer reducing a current consumption and providing a high operation speed.

DESCRIPTION OF PRIOR ART

An input buffer buffers an external signal and inputs the external signal into the semiconductor device. A static input buffer is the simplest type of the input buffer. The static input buffer is implemented with an inverter provided with an NMOS transistor and a PMOS transistor serially connected to each other. A simple structure is an advantage of using the static input buffer. However, the static input buffer is sensitive to a noise. Therefore, a swing level of an input to the static input buffer has to be large. Accordingly, the static input buffer is not suitable for use in a semiconductor device which requires an input signal having relatively low swing level or having extremely high operation frequency.

In order to overcome the abovementioned limit of the static input buffer, an amplifying input buffer is proposed.

FIG. 1 is a schematic circuit diagram depicting a conventional differential amplifying input buffer.

As shown, the conventional differential amplifying input buffer is provided with a comparator 10 and a bias NMOS transistor NM1. The bias NMOS transistor NM1 is controlled by a buffer enable signal BUFF_EN. The comparator 10 receives an input data IN and a reference voltage VREF as differential inputs. The reference voltage VREF is a constant voltage having a fixed voltage level and is provided through a predetermined input pin of the semiconductor device from the outside or internally generated in the semiconductor device. The reference voltage usually have a half of a power supply voltage VDD, i.e., VDD/2.

FIG. 2 is a schematic circuit diagram depicting the differential amplifying input buffer shown in FIG. 1.

As shown, the comparator 10 of the conventional differential amplifying input buffer is provided with a first input NMOS transistor Q5 receiving the reference voltage VREF through its gate, a second input NMOS transistor Q6 receiving the input data IN through its gate, a first load PMOS transistor Q2 connected between the power supply voltage VDD and the first input NMOS transistor Q5, and a second load PMOS transistor Q3 connected between the power supply voltage VDD and the second input NMOS transistor Q6. Herein, the first and second load PMOS transistors Q2 and Q3 form a current mirror.

The comparator 10 further includes a first PMOS transistor Q1 connected between the power supply voltage VDD and the first input NMOS transistor Q5 and a second PMOS transistor Q4 connected between the power supply voltage VDD and the second input NMOS transistor Q6. The first PMOS transistor Q1 is parallel connected to the first load PMOS transistor Q2 at a first node N1 and receives the buffer enable signal BUFF_EN through its gate. The second PMOS transistor Q4 is parallel connected to the second load PMOS transistor Q3 at a second node N2 and receives the buffer enable signal BUFF_EN through its gate.

Further, the comparator 10 also includes an inverter INV being connected to the second output node N2 and performing a buffering operation.

The bias NMOS transistor NM1 is connected between a ground voltage VSS and the first and second input NMOS transistors Q5 and Q6 and receives the buffer enable signal BUFF_EN.

The first input NMOS transistor Q5 receiving the reference voltage passes a first current I1. An amount of the first current I1 is always same because the level of the reference voltage VREF is constant. Meanwhile, the second input NMOS transistor Q6 passes a second current I2. An amount of the second current I2 is determined in response to a voltage level of the input data IN inputted to the gate of the second input NMOS transistor Q6. Thus, a voltage level of the second output node N2 is determined by quantitatively comparing the amount of the first current I1 with the amount of the second current I2.

When the buffer enable signal BUFF_EN is activated to a logic level 'H', the bias NMOS transistor NM1 is turned-on and the first and second PMOS transistor Q1 and Q4 are turned-off. Then, the input buffer works normally.

Meanwhile, when the buffer enable signal BUFF_EN is inactivated to a logic level 'L', the bias NMOS transistor NM1 is turned-off and the input buffer is disenabled. Further, the first and second PMOS transistors Q1 and Q4 are turned-on and precharge a first output node N1 and the second output node N2 to a logic level 'H'. Therefore, a current directly passing from the power supply voltage VDD to the ground voltage VSS is prevented, and a current consumption of the input buffer is reduced. Herein, the current is occurred when the level of the input data IN is changed from a logic level 'H' to a logic level 'L', and vice versa.

As abovementioned, in the conventional input buffer, the bias NMOS transistor NM1 controlling the amount of the current passing through the comparator 10 is controlled by the buffer enable signal BUFF_EN. Therefore, the input buffer has a problem for controlling the operation speed of the comparator 10. In other words, when the level of the power supply voltage VDD is high, the source-drain voltage of the transistors in the comparator becomes high. Accordingly, the operation speed of the comparator 10 becomes excessively rapid. On the contrary, when the level of the power supply voltage VDD is low, the operation speed of the comparator 10 becomes too slow. Further, when the level of the power supply voltage VDD is high, an immoderate amount of current is consumed because of the excessively high operation speed of the comparator 10.

SUMMARY OF THE INVENTION

It is, therefore, an object of the present invention to provide an input buffer for use in a semiconductor device reducing a current consumption and providing a high operation speed.

In accordance with an aspect of the present invention, there is provided an input buffer includes a comparator, having a first biasing device controlled by a buffer enable signal, for sensing a logic level of an input data by comparing voltage levels of a reference voltage and the input data, a reference voltage detector for detecting the level of the reference voltage, and a second biasing device controlled by an output signal from the reference voltage detector and parallel connected to the first biasing device.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an input buffer for use in a semiconductor device in accordance with the present invention will be described in detail referring to the accompanying drawings.

Figure 1:
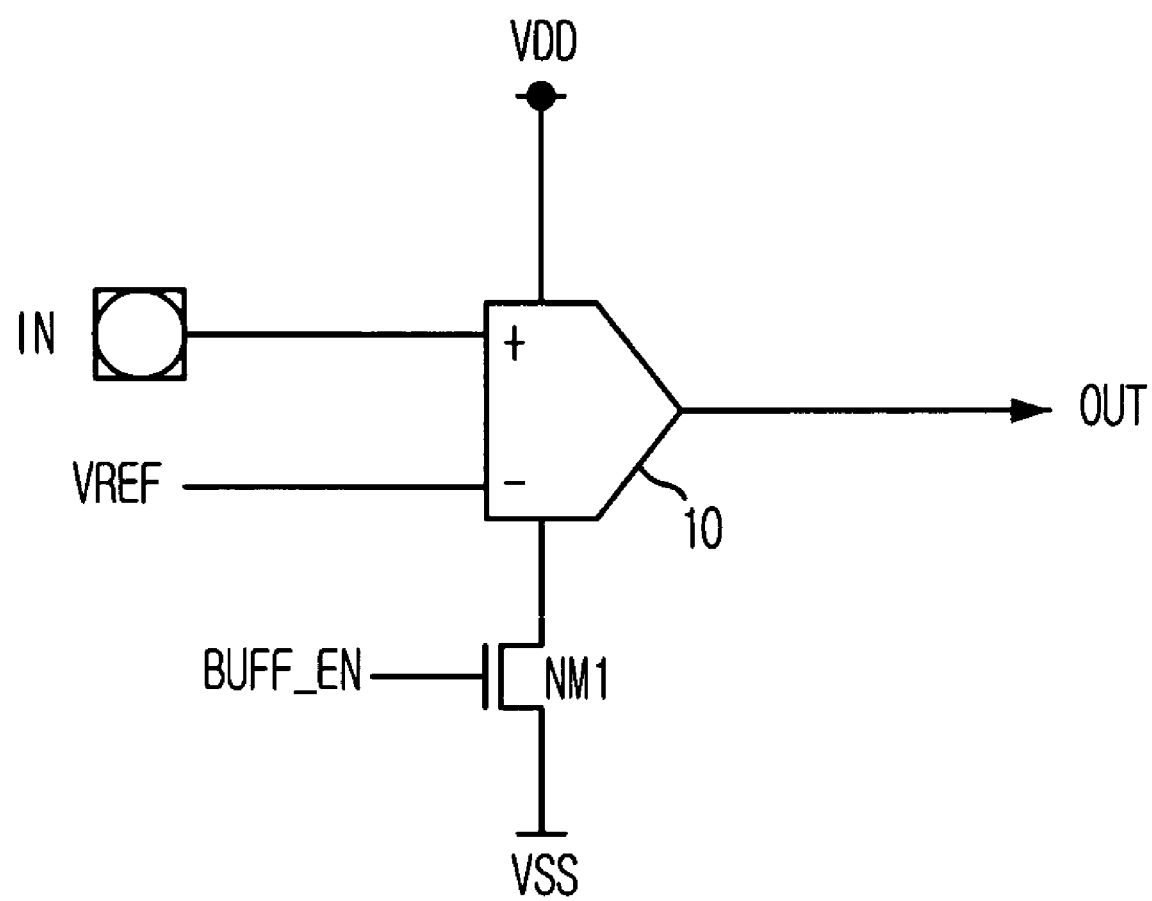
FIG. 1 is a schematic circuit diagram depicting a conventional differential amplifying input buffer.
Figure 2:
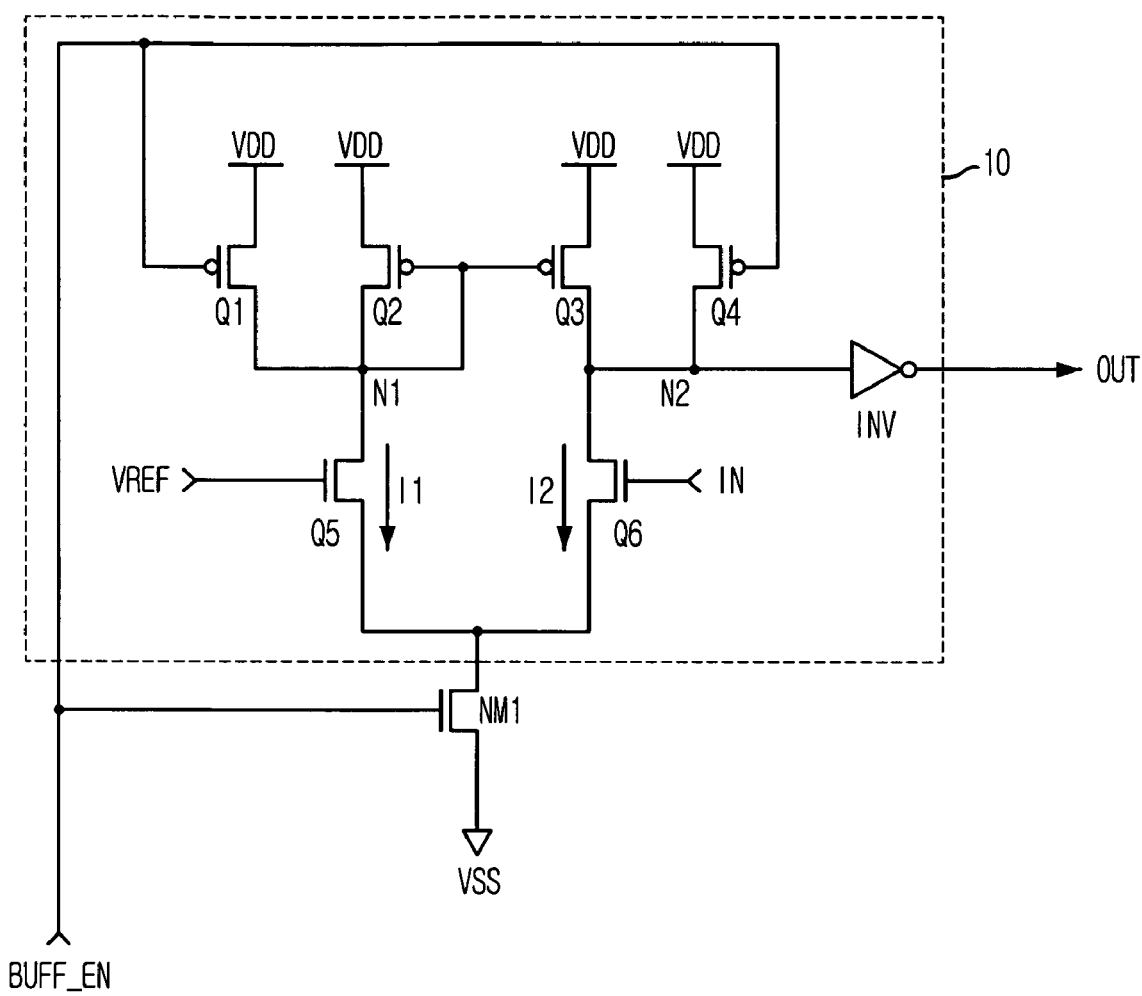
FIG. 2 is a schematic circuit diagram depicting the differential amplifying input buffer shown in FIG. 1.
Figure 3:
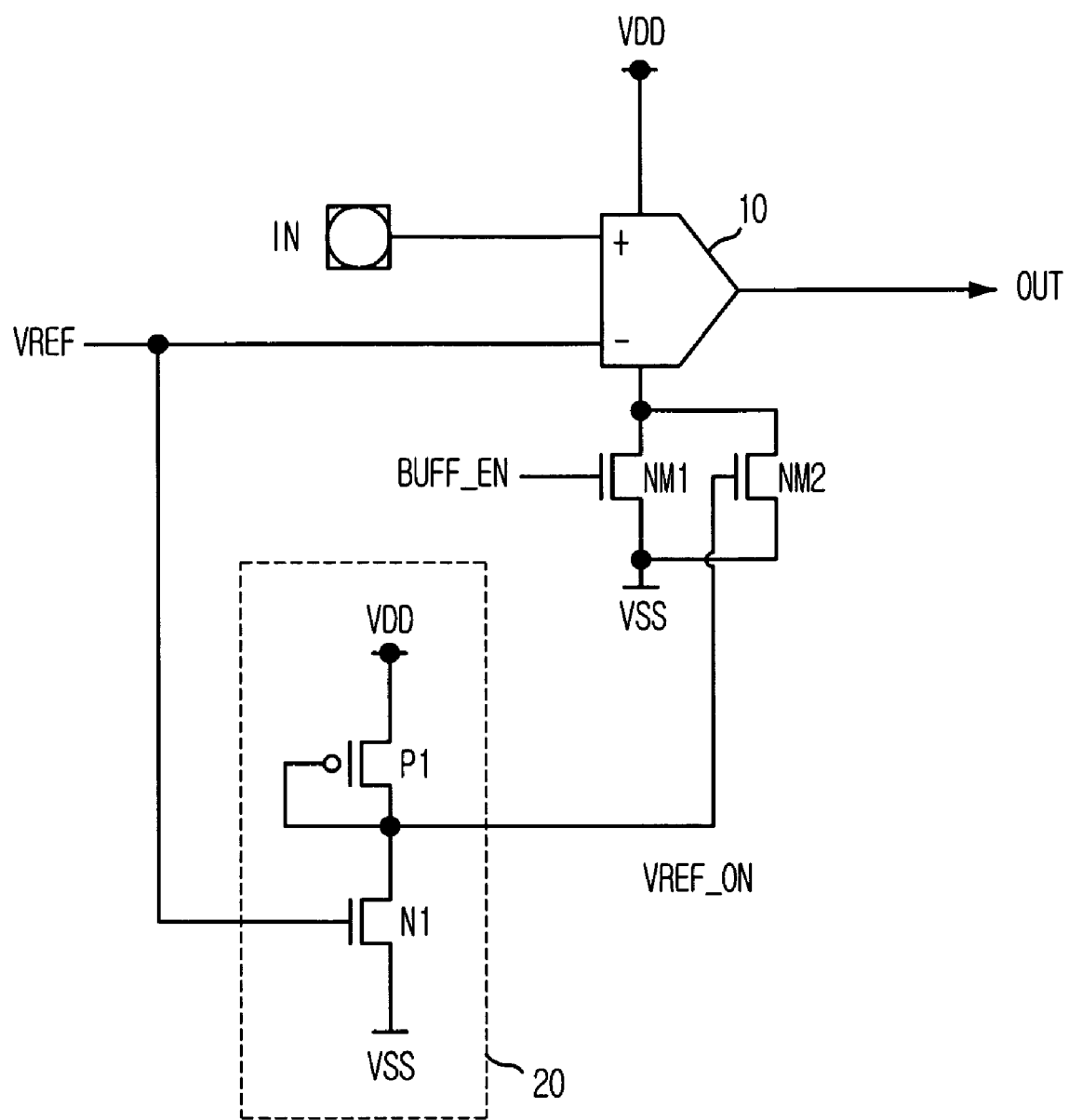
FIG. 3 is a schematic circuit diagram depicting an input buffer in accordance with a preferred embodiment of the present invention.

FIG. 3 is a schematic circuit diagram depicting an input buffer in accordance with a preferred embodiment of the present invention.

As shown, the input buffer includes a first bias NMOS transistor NM1 controlled by a buffer enable signal BUFF_EN, a comparator 10 for sensing a logic level of an input data IN by comparing with a voltage level of the input data IN with that of a reference voltage VREF, a reference voltage detector 20 for detecting a voltage level of the reference voltage VREF, and a second bias NMOS transistor NM2 controlled by an output signal VREF_ON from the reference voltage detector 20 and parallel connected to the first bias NMOS transistor NM1.

Herein, the reference voltage detector 20 is provided with a first NMOS transistor N1 and a first PMOS transistor P1. The first NMOS transistor N1 and the first PMOS transistor P1 are serially connected to each other. The first NMOS transistor N1 receives the reference voltage VREF through its gate. A source of the first NMOS transistor N1 is connected to a ground voltage VSS, and a drain of the first NMOS transistor N1 is connected to an output terminal of the reference voltage detector 20. A source of the first PMOS transistor P1 is connected to a power supply voltage VDD, and a gate and a drain of the first PMOS transistor P1 are connected to the output terminal.

Figure 4:
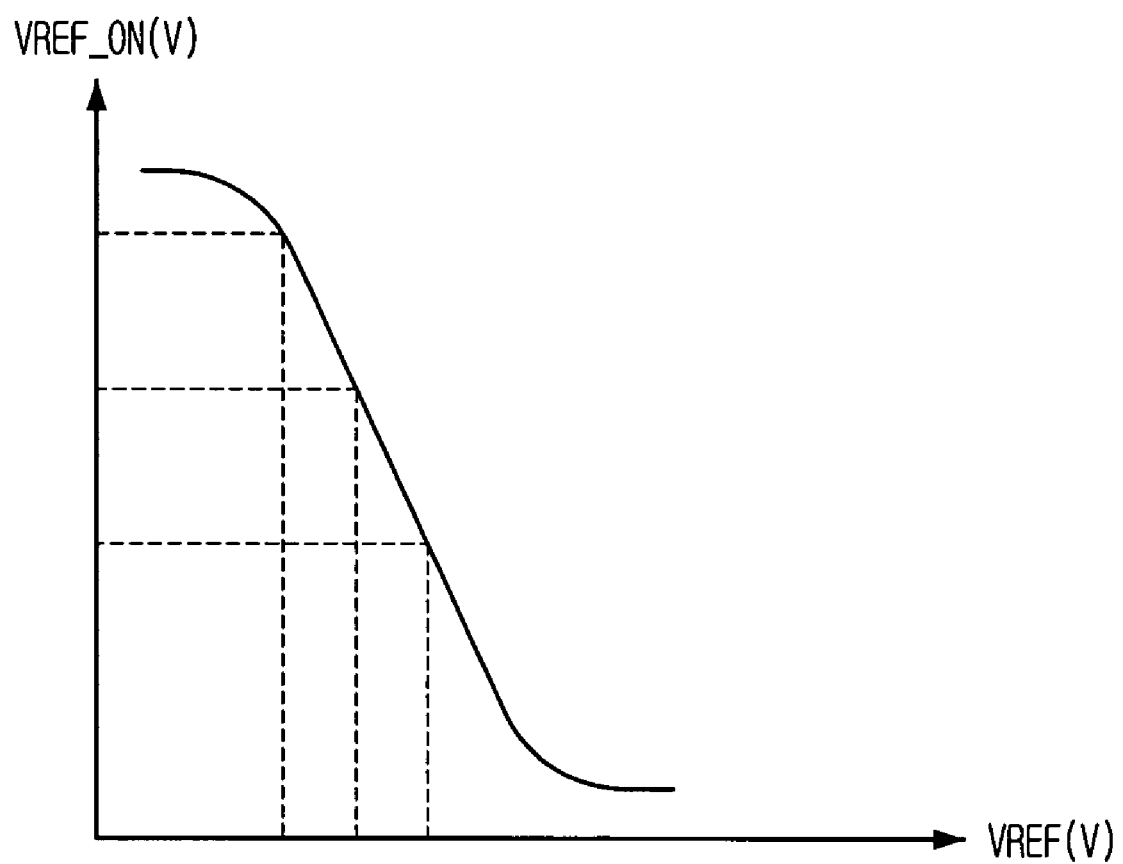
FIG. 4 is diagram showing a variation of the output signal of the reference voltage detector in response to the reference voltage.

FIG. 4 is diagram showing a variation of the output signal VREF_ON of the reference voltage detector 20 in response to the reference voltage VREF.

As shown, as the level of the reference voltage VREF becomes higher, a voltage level of the output signal VREF_ON from the reference voltage detector 20 becomes lower, because the first NMOS transistor discharges the output terminal of the reference voltage detector 20 in response to the level of the reference voltage VREF.

A basic operation of the input buffer shown in FIG. 3 is similar to that of the conventional art. In other words, when the buffer enable signal BUFF_EN is activated to a logic level 'H', the first bias NMOS transistor NM1 is turned-on and the input buffer works normally.

When the enable signal BUFF_EN is activated to the logic level 'H', if a level of the power supply voltage VDD is low, the level of the reference voltage VREF having VDD/2 is also low. When the reference voltage VREF with the low voltage level is inputted to the reference voltage detector 20, the level of the output signal VREF_ON of the reference voltage detector 20 becomes high. Accordingly, a gate-source voltage VGS of the second bias NMOS transistor NM2 is increased, and an amount of a sink current of the comparator 10 is also increased. When the amount of the sink current of the comparator 10 is increased, response time of transistors in the comparator 10 is improved. Thus, an operation speed of the comparator 10 becomes faster.

Meanwhile, when the level of the power supply voltage VDD is high, the level of the reference voltage is also high. When the reference voltage with high voltage level is inputted to the reference voltage detector 20, the level of the output signal from the reference voltage detector 20 becomes low. Accordingly, the level of the gate-source voltage VGS is decreased, and the amount of the sink current of the comparator 10 is also decreased. When the amount of the sink current of the comparator 10 is decreased, the response time of the transistors in the comparator 10 goes down. That is, the input buffer shown in FIG. 3 consumes less current than the conventional art at the same power supply voltage VDD level.

As abovementioned, the input buffer of the present invention includes the two bias NMOS transistors NM1 and NM2 controlling the amount of the sink current of the comparator 10 in response to the level of the output signal VREF_ON of the reference voltage detector 20. Therefore, the input buffer obtains a high operation speed when the power supply voltage VDD is low and reduces a current consumption when the power supply voltage VDD is high.

Further, a size of the second bias NMOS transistor NM2 is determined in response to an expected amount of the sink current of the comparator 10.

Figure 5:
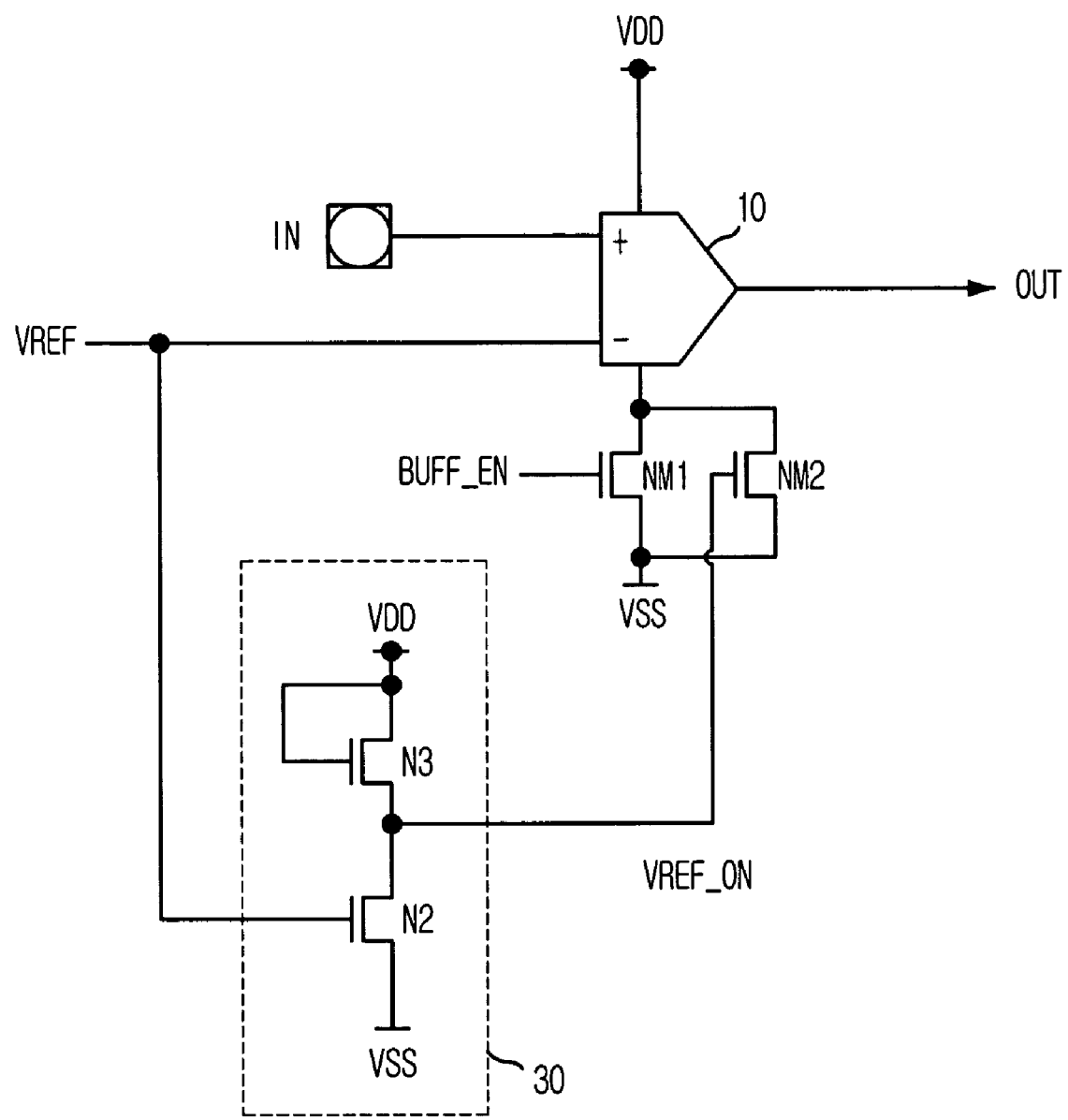
FIG. 5 is a schematic circuit diagram depicting an input buffer in accordance with another embodiment of the present invention.

FIG. 5 is a schematic circuit diagram depicting an input buffer in accordance with another embodiment of the present invention.

As shown, a reference voltage detector 30 is implemented differently with the reference voltage detector 20 in FIG. 3.

The reference voltage detector 30 in FIG. 5 is implemented with second and third NMOS transistors N2 and N3 serially connected each other. A source of the second NMOS transistor is connected to the ground voltage VSS, and a drain of the second NMOS transistor N2 is connected to an output terminal of the reference voltage detector 30. The reference voltage VREF is inputted to a gate of the second NMOS transistor N2. A source and a gate of the third NMOS transistor N3 are connected to the power supply voltage VDD, and a drain of the third NMOS transistor N3 is connected to the output terminal of the reference voltage detector 30. That is, meanwhile the reference voltage detector 20 in FIG. 3 uses PMOS diode bias by using the first PMOS transistor P1, the reference voltage detector 30 in FIG. 5 uses NMOS diode bias by using the third NMOS transistor N3.

Figure 6:
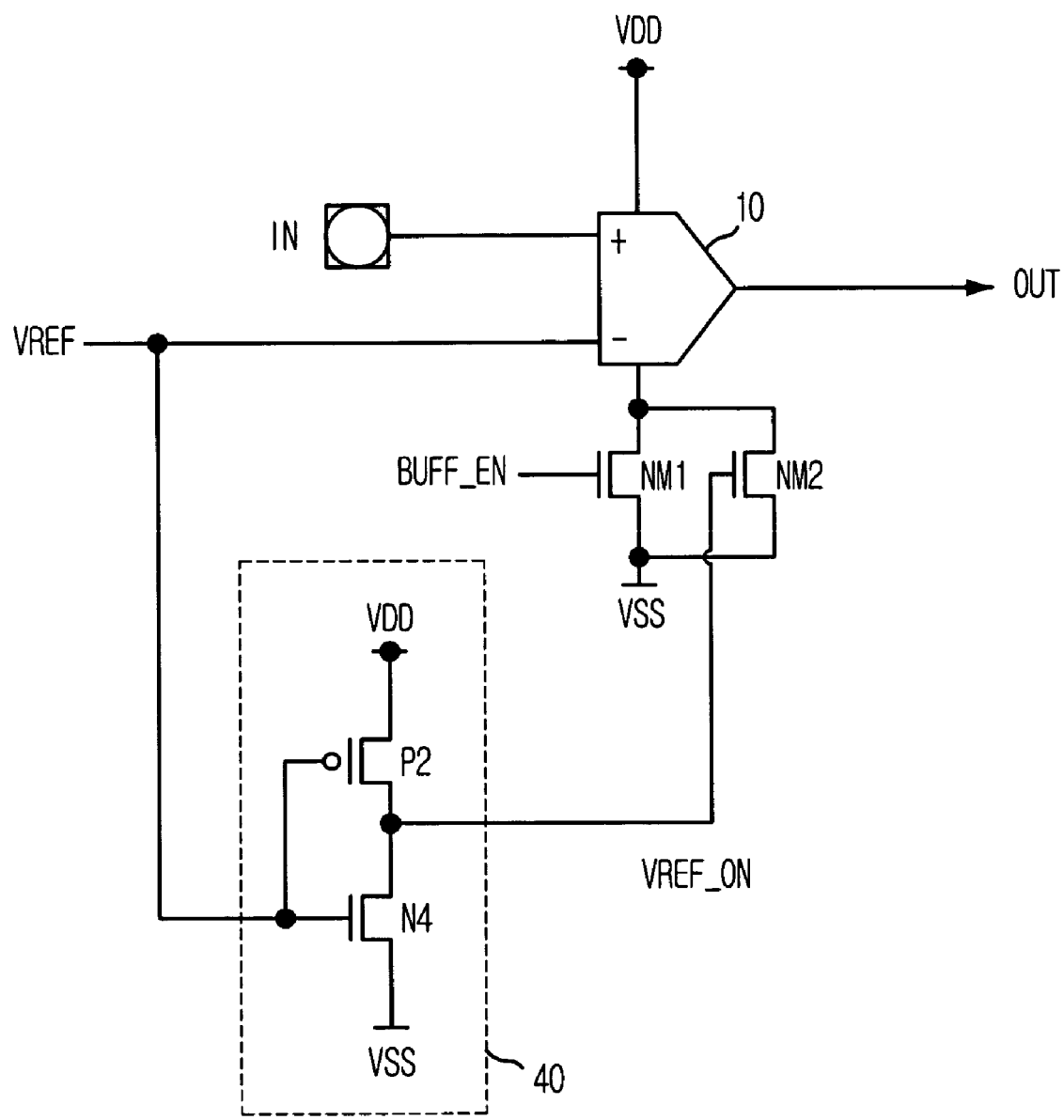
FIG. 6 is a schematic circuit diagram depicting an input buffer in accordance with still another embodiment of the present invention.

FIG. 6 is a schematic circuit diagram depicting an input buffer in accordance with still another embodiment of the present invention.

As shown, a reference voltage detector 40 in FIG. 6 is different with those in FIG. 3 and FIG. 5. The reference voltage detector 40 is provided with a fourth NMOS transistor N4 and a second PMOS transistor P2. A source of the fourth NMOS transistor N4 is connected to the ground voltage VSS, and a drain of the fourth NMOS transistor N4 is connected to an output terminal of the reference voltage detector 40. The reference voltage VREF is inputted to a gate of the fourth NMOS transistor N4. A source of the second PMOS transistor P2 is connected to the power supply voltage VDD, and a drain of the second PMOS transistor P2 is connected to the output terminal of the reference voltage detector 40. The reference voltage VREF is inputted to a gate of the second PMOS transistor P2. That is, the input buffer in FIG. 6 controls the level of the output signal VREF_ON from the reference voltage detector 40 by a CMOS amplifier implemented with the fourth NMOS transistor N4 and the second PMOS transistor P2.

Meanwhile, operations of the input buffers shown in FIGS. 5 and 6 are same with that of the input buffer of FIG. 3. Therefore, an explanation for the input buffers in FIGS. 5 and 6 is omitted.

Herein, the input buffers shown in FIGS. 3, 5, and 6 are implemented with a NMOS type differential amplifying circuit. The NMOS type amplifying circuit includes a current mirror connected to the power supply voltage VDD and a bias NMOS transistor connected to the ground voltage VSS. However, in other embodiment, the input buffer can be implemented with a PMOS type differential amplifying circuit. The PMOS type differential amplifying circuit has a current mirror connected to the ground voltage VSS and a bias PMOS transistor connected to the power supply voltage VDD. When the input buffer uses the PMOS type differential amplifying circuit, the input buffer controls an amount of a source current instead of the amount of the sink current.

The present invention provides an input buffer for use in a semiconductor device reducing a current consumption and maintaining a reliable operation speed by detecting a level of the reference voltage VREF.

The present application contains subject matter related to Korean patent application No. 2005-23334, filed in the Korean Patent Office on Mar. 21, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An input buffer for use in a semiconductor device, comprising:
    a comparing means controlled by a buffer enable signal for sensing a logic level of an input data by comparing voltage levels of a reference voltage and the input data;
    a reference voltage detecting means for detecting the level of the reference voltage;
    a first biasing means controlled by the buffer enable signal and connected between the comparing means and a ground voltage; and
    a second biasing means controlled by an output signal from the reference voltage detecting means and parallel connected to the first biasing means, wherein an amount of a current flowing through the comparing means is determined based on the buffer enable signal or the output signal from the reference voltage detecting means by the first and the second biasing means.

2. The input buffer as recited in claim 1, wherein the first biasing means includes a first NMOS transistor being connected to the ground voltage and receiving the buffer enable signal through a gate.

3. The input buffer as recited in claim 2, wherein the second biasing means is provided with a second NMOS transistor being parallel connected to the first NMOS transistor and receiving the output signal from the reference voltage detecting means through a gate.

4. The input buffer as recited in claim 3, wherein the reference voltage detecting means includes:
    a third NMOS transistor receiving the reference voltage through a gate, and whose source is connected to the ground voltage and whose drain is connected to an output terminal of the reference voltage detecting means; and
    a PMOS transistor whose source is connected to a power supply voltage and whose drain and gate are connected to the output terminal.

5. The input buffer as recited in claim 3, wherein the reference voltage detecting means includes:
    a third NMOS transistor receiving the reference voltage through a gate, and whose source is connected to the ground voltage and whose drain is connected to an output terminal of the reference voltage detecting means; and
    a fourth NMOS transistor whose source and gate is connected to a power supply voltage and whose drain is connected to the output terminal.

6. The input buffer as recited in claim 3, wherein the reference voltage detecting means includes:
    a third NMOS transistor receiving the reference voltage through a gate, and whose source is connected to the ground voltage and whose drain is connected to an output terminal of the reference voltage detecting means; and
    a PMOS transistor receiving the reference voltage through a gate, and whose source is connected to a power supply voltage and whose drain is connected to the output terminal.

7. An input buffer for use in a semiconductor device, comprising:
    a comparing unit controlled by a buffer enable signal for sensing a logic level of an input data by comparing voltage levels of a reference voltage and the input data;
    a reference voltage detecting unit for detecting the level of the reference voltage;
    a first biasing unit controlled by the buffer enable signal and connected between the comparing unit and a ground voltage; and
    a second biasing unit controlled by an output signal from the reference voltage detecting unit and parallel connected to the first biasing unit, wherein an amount of a current flowing through the comparing unit is determined based on the buffer enable signal or the output signal from the reference voltage detecting unit by the first and the second biasing unit.

8. The input buffer as recited in claim 7, wherein the first biasing unit includes a first NMOS transistor being connected to the ground voltage and receiving the buffer enable signal through a gate.

9. The input buffer as recited in claim 8, wherein the second biasing unit is provided with a second NMOS transistor being parallel connected to the first NMOS transistor and receiving the output signal from the reference voltage detecting unit through a gate.

10. The input buffer as recited in claim 9, wherein the reference voltage detecting unit includes:
    a third NMOS transistor receiving the reference voltage through a gate, and whose source is connected to the ground voltage and whose drain is connected to an output terminal of the reference voltage detecting unit; and
    a PMOS transistor whose source is connected to a power supply voltage and whose drain and gate are connected to the output terminal.

11. The input buffer as recited in claim 9, wherein the reference voltage detecting unit includes:
  a third NMOS transistor receiving the reference voltage through a gate, and whose source is connected to the ground voltage and whose drain is connected to an output terminal of the reference voltage detecting unit; and
  a fourth NMOS transistor whose source and gate is connected to a power supply voltage and whose drain is connected to the output terminal.

12. The input buffer as recited in claim 9, wherein the reference voltage detecting unit includes:
  a third NMOS transistor receiving the reference voltage through a gate, and whose source is connected to the ground voltage and whose drain is connected to an output terminal of the reference voltage detecting unit; and
  a PMOS transistor receiving the reference voltage through a gate, and whose source is connected to a power supply voltage and whose drain is connected to the output terminal.

* * * * *